(12) United States Patent
Ruan et al.

(10) Patent No.: US 11,402,434 B2
(45) Date of Patent: Aug. 2, 2022

(54) BATTERY STATE ESTIMATION METHOD, APPARATUS, DEVICE, BATTERY SYSTEM AND STORAGE MEDIUM

(71) Applicant: Contemporary Amperex Technology Co., Limited, Ningde (CN)

(72) Inventors: Jian Ruan, Ningde (CN); Mingshu Du, Ningde (CN); Shichao Li, Ningde (CN); Shenzhi Tang, Ningde (CN); Yanhua Lu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 0 days.

(21) Appl. No.: 17/565,460

(22) Filed: Dec. 30, 2021

(65) Prior Publication Data

US 2022/0120820 A1 Apr. 21, 2022

Related U.S. Application Data

(63) Continuation of application No. PCT/CN2020/099909, filed on Jul. 2, 2020.

(51) Int. Cl.
*G01R 31/3842* (2019.01)
*G01R 31/392* (2019.01)
*G01R 31/396* (2019.01)

(52) U.S. Cl.
CPC ....... *G01R 31/3842* (2019.01); *G01R 31/392* (2019.01); *G01R 31/396* (2019.01)

(58) Field of Classification Search
None
See application file for complete search history.

(56) References Cited

U.S. PATENT DOCUMENTS

| 2010/0085009 A1* | 4/2010 | Kang | H02J 7/0016 |
| | | | 324/427 |
| 2012/0074898 A1* | 3/2012 | Schwartz | H02J 7/0018 |
| | | | 320/134 |

(Continued)

FOREIGN PATENT DOCUMENTS

| CN | 103901354 A | 7/2014 |
| CN | 206878453 U | 1/2018 |

(Continued)

OTHER PUBLICATIONS

The International search report for PCT Application No. PCT/CN2020/099909, dated Mar. 31, 2021, 10 pages.

(Continued)

*Primary Examiner* — Jas A Sanghera
(74) *Attorney, Agent, or Firm* — Law Offices of Liaoteng Wang

(57) ABSTRACT

The present application provides a battery state estimation method, which relates to the field of battery technology. The battery state estimation method includes: obtaining a first cell state parameter of each of a plurality of cells in a battery; under a condition that there are multiple cell partitions, determining whether the first cell state parameter of each cell belonging to a cell partition is within a first cell state parameter range corresponding to the cell partition; when it is within the first cell state parameter range corresponding to the cell partition, estimating a cell state of each of the cell partitions based on a target cell state parameter corresponding to the cell partition; and estimating a battery state of the battery based on the cell state.

18 Claims, 4 Drawing Sheets

(56) References Cited

U.S. PATENT DOCUMENTS

| | | |
|---|---|---|
| 2013/0207462 A1 | 8/2013 | Boehm |
| 2013/0234719 A1* | 9/2013 | Sekizaki ............. H01M 10/425 |
| | | 324/433 |
| 2018/0267106 A1 | 9/2018 | Kusano et al. |
| 2018/0306865 A1* | 10/2018 | Verbrugge ............ H02J 7/0021 |
| 2019/0190091 A1 | 6/2019 | Kim et al. |

FOREIGN PATENT DOCUMENTS

| | | |
|---|---|---|
| CN | 108549032 A | 9/2018 |
| CN | 109596985 A | 4/2019 |
| CN | 109596986 A | 4/2019 |
| CN | 110031770 A | 7/2019 |
| CN | 109164398 B | 10/2019 |
| CN | 110568362 A | 12/2019 |
| JP | 2019164969 A | 9/2019 |

OTHER PUBLICATIONS

The Extended European Search Report for European Application No. 20923695.9, dated Jun. 3, 2022, 7 pages.

* cited by examiner

# BATTERY STATE ESTIMATION METHOD, APPARATUS, DEVICE, BATTERY SYSTEM AND STORAGE MEDIUM

CROSS-REFERENCE TO RELATED APPLICATIONS

This application is a continuation of International Application No. PCT/CN2020/099909 filed on Jul. 2, 2020, which is incorporated herein by reference in its entirety.

TECHNICAL FIELD

The present application relates to the field of battery technology, and in particular, to a battery state estimation method, apparatus, device, battery system and storage medium.

BACKGROUND

At present, in order to increase the capacity of a battery, the battery usually includes multiple cells.

During runtime of the battery, a battery management system (BMS) needs to estimate the states of the cells inside the battery.

However, when the current battery management system estimates the battery state of the battery, since each cell may have consistency differences in the manufacturing process, the basic parameters of respective cells may be different, and in actual use, the aging degrees of respective cells are different, so there may be a large estimation error when estimating the battery state of the battery, especially for the battery including cells that deviate from the normal state, the estimation result may even be incorrect. As a result, the reliability and accuracy of the management of the entire battery are not high, and it is easy to cause safety problems.

SUMMARY

Embodiments of the present application provide a battery state estimation method, apparatus, device, battery system and storage medium.

In a first aspect, embodiments of the present application provide a battery state estimation method, including:

obtaining a first cell state parameter of each of a plurality of cells in a battery;

under a condition that there are multiple cell partitions, performing the following step for each of the cell partitions: determining whether the first cell state parameter of each cell belonging to a cell partition is within a first cell state parameter range corresponding to the cell partition;

under a condition that the first cell state parameter of each cell in each of the cell partitions is within the first cell state parameter range corresponding to the cell partition, performing the following step for each of the cell partitions: estimating a cell state of each of the cell partitions based on a target cell state parameter corresponding to the cell partition; and estimating a battery state of the battery based on the cell state;

wherein a deviation of the first cell state parameter among individual cells belonging to a same cell partition is within a first deviation range.

As an implementation of the first aspect of the present application, the battery state estimation method further includes:

after determining whether the first cell state parameter of each cell belonging to a cell partition is within the first cell state parameter range corresponding to the cell partition, under a condition that the first cell state parameter of a first cell in a first cell partition is not within the first cell state parameter range corresponding to the first cell partition, adjusting the cell partition to which the first cell belongs based on the first cell state parameter of the first cell to obtain the adjusted cell partition;

performing the following step for each adjusted cell partition: estimating the cell state of the adjusted cell partition based on the target cell state parameter corresponding to the adjusted cell partition.

As an implementation of the first aspect of the present application, the battery state estimation method further includes:

after obtaining the first cell state parameter of each of the plurality of cells in the battery, under a condition that there are no multiple cell partitions, partitioning the cells based on the first cell state parameter of each cell to assign the cells among which a deviation of the first cell state parameter is within the first deviation range to a same cell partition;

performing the following step for each of the cell partitions: estimating the cell state of each of the cell partitions based on the target cell state parameter corresponding to the cell partition.

As an implementation of the first aspect of the present application, obtaining the first cell state parameter of each of the plurality of cells in the battery, specifically includes:

obtaining a cell parameter of each cell, wherein the cell parameter comprises at least one of: voltage, current, and temperature;

calculating the first cell state parameter of a corresponding cell based on the cell parameter.

As an implementation of the first aspect of the present application, the first cell state parameter comprises an open circuit voltage (OCV) curve and/or a cell capacity.

As an implementation of the first aspect of the present application, the cell state includes at least one of: a state of charge, a state of health, and a state of power.

In a second aspect, embodiments of the present application provide a battery state estimation apparatus, including:

an obtaining module configured to obtain a first cell state parameter of each of a plurality of cells in a battery;

a determination module configured to, under a condition that there are multiple cell partitions, perform the following step for each of the cell partitions: determining whether the first cell state parameter of each cell belonging to a cell partition is within a first cell state parameter range corresponding to the cell partition;

a first estimation module configured to, under a condition that the first cell state parameter of each cell in each of the cell partitions is within the first cell state parameter range corresponding to the cell partition, perform the following step for each of the cell partitions: estimating a cell state of each of the cell partitions based on a target cell state parameter corresponding to the cell partition;

a second estimation module configured to estimate a battery state of the battery based on the cell state;

wherein a deviation of the first cell state parameter among individual cells belonging to a same cell partition is within a first deviation range.

As an implementation of the second aspect of the present application, the battery state estimation apparatus further includes:

an adjustment module configured to, under a condition that the first cell state parameter of a first cell in a first cell partition is not within the first cell state parameter range corresponding to the first cell partition, adjust the cell partition to which the first cell belongs based on the first cell state parameter of the first cell to obtain the adjusted cell partition;

a third estimation module configured to perform the following step for each adjusted cell partition: estimating the cell state of the adjusted cell partition based on the target cell state parameter corresponding to the adjusted cell partition.

As an implementation of the second aspect of the present application, the battery state estimation apparatus further includes:

a partition module, after obtaining the first cell state parameter of each of the plurality of cells in the battery, the partition module is configured to, under a condition that there are no multiple cell partitions, partition the cells based on the first cell state parameter of each cell to assign the cells among which a deviation of the first cell state parameter is within the first deviation range in a same cell partition;

a fourth estimation module configured to perform the following step for each of the cell partitions: estimating the cell state of each of the cell partitions based on the target cell state parameter corresponding to the cell partition.

As an implementation of the second aspect of the present application, the obtaining module specifically includes:

an obtaining unit configured to obtain a cell parameter of each cell, the cell parameter includes at least one of voltage, current, and temperature;

a calculation unit configured to calculate the first cell state parameter of the corresponding cell based on the cell parameter.

As an implementation of the second aspect of the present application, the first cell state parameter comprises an OCV curve and/or a cell capacity.

As an implementation of the second aspect of the present application, the cell state includes at least one of: a state of charge, a state of health, and a state of power.

In a third aspect, embodiments of the present application provide a battery system, including the battery state estimation apparatus as provided in the second aspect.

In a fourth aspect, embodiments of the present application provide a battery state estimation device, including the battery state estimation method as provided in the first aspect.

BRIEF DESCRIPTION OF THE DRAWINGS

The present application can be better understood from the following detailed description in conjunction with the accompanying drawings, in which the same or similar reference numerals represent the same or similar features.

Figure 1:
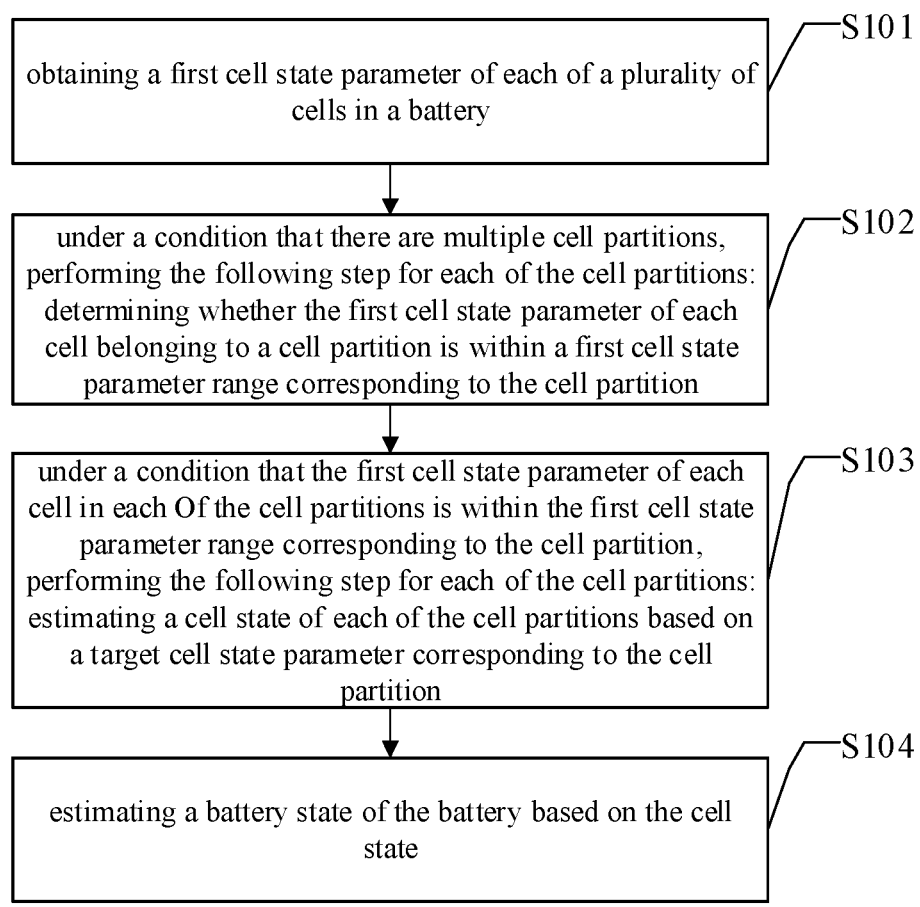
FIG. 1 is a schematic flowchart of a battery state estimation method provided by an embodiment of the present application.

In the accompanying drawings, drawings are not drawn to actual scale.

DETAILED DESCRIPTION

Features and exemplary embodiments of various aspects of the present application will be described in detail below.

In the following detailed description, many specific details are proposed in order to provide a comprehensive understanding of the present application. However, it is obvious to those skilled in the art that the present application can be implemented without some of these specific details. The following description of the embodiments is only to provide a better understanding of the present application by showing examples of the present application. The present application is not limited to any specific configurations and algorithms proposed below, but covers any modification, replacement and improvement of elements, components and algorithms without departing from the spirit of the present application. In the drawings and the following description, well-known structures and technologies are not shown in order to avoid unnecessary obscurity of the present application.

A battery may include a plurality of cells, and the quality of the cells directly determine the quality of a rechargeable battery. In order to know the quality of the rechargeable battery more accurately, battery state such as state of charge (SOC) of the battery will be estimated through the open circuit voltage (OCV) included in the battery.

However, due to the differences of the cells in the manufacturing process and in the aging degree during use, the capacities of the cells contained in the battery and the OCVs of the cells will have some fluctuations, and some of the cells deviate from the normal state. If the SOC of the battery is calculated based on the capacities and the OCVs of the cells with too many deviations from the normal state using a unified standard (a set of set parameters or a set initial capacity, for example, an OCV-SOC curve), it is very easy to cause a large deviation in the calculated SOC of the battery, and the accuracy of the estimated SOC of the battery will be low.

In view of this, an embodiment of the present application provides a battery state estimation method. For details, please refer to the flowchart of the battery state estimation method shown in FIG. 1.

As shown in FIG. 1, the battery state estimation method includes:

S101: obtaining a first cell state parameter of each a plurality of cells in the battery.

The first cell state parameter includes at least one of: an OCV curve and/or a cell capacity.

In some embodiments of the present application, based on the estimation of different battery states, the OCV curve may be a different OCV curve. For example, when estimating the state of charge (SOC) of the battery, the OCV curve can be an OCV-SOC curve; when estimating the state of health (SOH) of the battery, the OCV curve can be an OCV-SOH curve; when estimating the state of power (SOP) of the battery, the OCV curve can be an OCV-SOP curve.

In some embodiments of the present application, a battery state estimation apparatus may calculate a first state parameter of each cell by obtaining the cell parameter of each cell included in the battery, and thus the first state parameter of each cell can be calculated.

The cell parameter may include voltage, current, temperature, and so on.

As an example, based on the obtained voltage and temperature values of each cell, the battery state estimation apparatus may calculate the OCV curve based on, when the cell is in an open circuit state, the potential differences between two ends of the cell at different temperatures; the apparatus can also calculate the amount of electricity that the battery can release, i.e., the cell capacity, based on the obtained voltage, temperature, and current of the cell.

As another example, the cell capacity may be estimated further based on high and low points of standing and a net capacity, or estimated by obtaining an OCV sequence and a net cumulative throughput sequence in a static process to generate OCV-SOC curve, OCV-SOH curve, OCV-SOP curve, etc.

S102: under a condition that there are multiple cell partitions, performing the following step for each of the cell partitions: determining whether the first cell state parameter of each cell belonging to a cell partition is within a first cell state parameter range corresponding to the cell partition.

Wherein a deviation of the first cell state parameter among individual cells belonging to a same cell partition is within a first deviation range.

In some embodiments of the present application, multiple cell partitions may be set for the battery based on different first cell state parameter ranges in advance, wherein each of the cell partitions corresponds to a first cell state parameter range.

In this way, after obtaining the first cell state parameter of each of the plurality of cells in the battery, the battery state estimation apparatus may firstly determine whether there are multiple cell partitions, and if there are multiple cell partitions, needs to further determine, for each of the cell partitions, whether the first cell state parameter of each cell belonging to a cell partition is within a first cell state parameter range corresponding to the cell partition in order to ensure that each cell in the same cell partition having a deviation of the first cell state parameter among individual cells within the first deviation range, wherein the first cell state parameter range can be understood as a parameter range in which the deviation of the first state parameter is within the first deviation range.

In some other embodiments of the present application, the first deviation range may be determined based on an applicable range of the first cell state parameter of each cell in the corresponding cell partition. For example, the first deviation range may be the applicable range in which the difference values between all the first cell state parameter values in the corresponding cell partition falls.

S103: under a condition that the first cell state parameter of each cell of each of the cell partitions is within the first cell state parameter range corresponding to the cell partition, performing the following step for each of the cell partitions: estimating a cell state in each of the cell partitions based on a target cell state parameter corresponding to the cell partition.

In some embodiments of the present application, the cell state includes at least one of: SOC, SOH, and SOP In some other embodiments of the present application, after determining that the first cell state parameter of each cell of each of the cell partitions is within the first cell state parameter range corresponding to the cell partition, the cell state of each of the cell partitions can be estimated based on the target cell state parameter corresponding to each of the cell partitions.

Here the target cell state parameter corresponding to each of the cell partitions may be the OCV-SOC curve corresponding to an average value of the OCV values of all cells in the corresponding cell partition, and an average value of the cell capacities of all cells in the corresponding cell partition; or may be the OCV-SOC curve corresponding to a median value of the OCV values of all cells in the corresponding cell partition, and a median value of the cell capacities of all cells in the corresponding cell partition. Alternatively, the target cell state parameter corresponding to each of the cell partitions may be the OCV-SOC curve corresponding to the average value of the OCV values of all cells in the corresponding cell partition, and the median value of the cell capacities of all cells in the corresponding cell partition, or may be the OCV-SOC curve corresponding to the median value of the OCV values of all cells in the corresponding cell partition, and the average value, maximum value, or minimum value of the cell capacities of all cells in the corresponding cell partition, with no limitation imposed thereon.

In this way, the cell state of each of the cell partitions may be based on the target cell state parameter (the OCV curve and/or the cell capacity), and the cell state of the cell partition (at least one of SOC, SOH and SOP) can be estimated.

S104: estimating a battery state of the battery based on the cell state.

In some embodiments of the present application, after the cell state of each of the cell partitions is estimated, the battery state of the battery can be estimated based on the cell states of all cell partitions included in the battery.

As an example, A battery for which the battery state needs to be estimated includes 5 cell partitions, namely cell partition A, cell partition B, cell partition C, cell partition D, and cell partition E.

In the method described in the above embodiment, firstly, determining whether the first cell state parameter of each cell in each of the cell partitions is within the first cell state parameter range corresponding to the cell partition; if so, performing the following step for each of the cell partitions: estimating the SOC of each of the cell partitions based on the target cell state parameter corresponding to the cell partition.

For example, based on the target cell state parameter corresponding to the cell partition A, the SOC corresponding to the cell partition A can be obtained as SOC1. Specifically, one method may include: estimating the SOC value of each cell in cell partition A based on the OCV value of each cell in cell partition A and the target cell state parameter corresponding to the cell partition A, and converting the sum of a maximum SOC value and a minimum SOC value in the cell partition A to obtain the SOC value corresponding to cell partition A as SOC1. In the same way, based on the target cell state parameter corresponding to the cell partition B, the SOC value corresponding to the cell partition B can be obtained as SOC2; based on the target cell state parameter corresponding to the cell partition C, the SOC value corresponding to the cell partition C can be obtained as SOC3; based on the target cell state parameter corresponding to the cell partition D, the SOC value corresponding to the cell partition D can be obtained as SOC4; based on the target cell state parameter corresponding to the cell partition E, the SOC value corresponding to the cell partition E can be obtained as SOC5. Those skilled in the art should understand that the cell state of each of the cell partitions may be estimated from the cell capacity, or may be estimated using other conversion methods, for example, by taking the minimum value or average value of the SOC in the cell partition, with no limitation imposed thereon.

Next, when estimating the battery state of the battery, the sum of the maximum SOC and the minimum SOC from SOC1 to SOC5 corresponding to cell partitions A to E can be converted, and the converted SOC value is used as the SOC value of the battery.

As another example, a SOH of each of the cell partitions may be estimated using the method described in the above embodiment. For example, the SOH corresponding to cell partition A is SOH1, the SOH corresponding to cell partition B is SOH2, the SOH corresponding to cell partition C is SOH3, the SOH corresponding to cell partition D is SOH4, and the SOH corresponding to cell partition E is SOH5.

Next, when estimating the battery state of the battery, the sum of the maximum SOH and the minimum SOH from SOH1 to SOH5 corresponding to cell partitions A to E can be converted, and the converted SOH value is used as the SOH value of the battery.

In the embodiment of the present application, by obtaining a first cell state parameter of each of a plurality of cells in a battery, and under a condition that there are multiple cell partitions, by determining that the first cell state parameter of each cell belonging to a cell partition is within the first state parameter range corresponding to the cell partition, it is possible to estimate the cell state in each of the cell partitions just using the target cell state parameter corresponding to each of the cell partitions. In this way, when estimating the battery state of the battery, since the target cell state parameters corresponding to respective cell partitions are different, a unified standard is no longer used when estimating the battery state. Instead, the cell state of each of the cell partitions is calculated according to the target cell state parameter of each of the cell partitions in the battery, so that the battery state is estimated according to the cell state of each of the cell partitions, thereby improving the accuracy of the battery state estimation.

Figure 2:
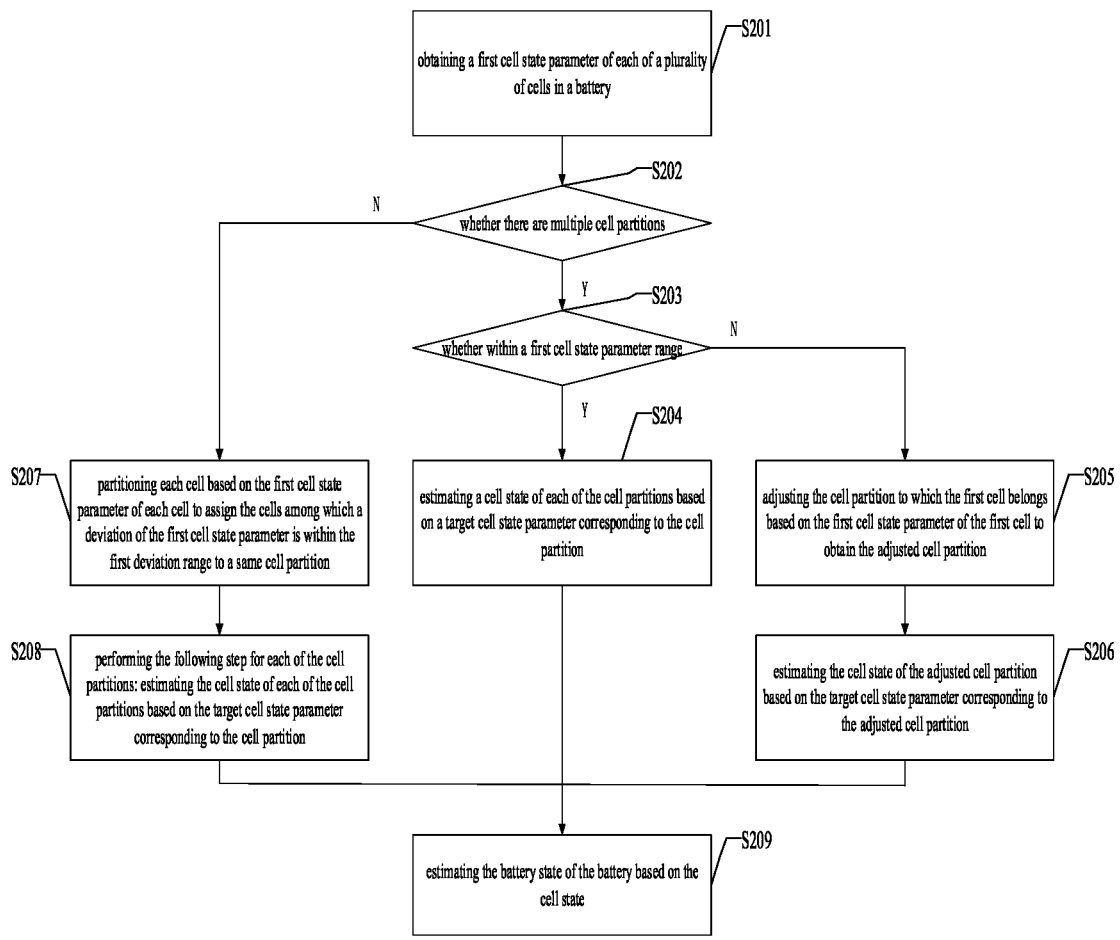
FIG. 2 is a schematic flowchart of a battery state estimation method provided by another embodiment of the present application.

In some embodiments of the present application, in order to avoid using a unified standard when estimating the battery state, the cells included in the battery are partitioned in advance, or when the deviations of the first cell state parameters belonging to the same cell partition are not within the first deviation range, the cell partition is readjusted, as shown in FIG. 2.

FIG. 2 is a schematic flowchart of a battery state estimation method according to another embodiment of the present application. As shown in FIG. 2, the battery state estimation method includes:

S201: obtaining a first cell state parameter of each of a plurality of cells in a battery.

S202: determining whether there are multiple cell partitions, and if there are multiple cell partitions, performing step S203; if there are no multiple cell partitions, performing step S207.

S203: performing the following step for each of the cell partitions: determining whether the first cell state parameter of each cell belonging to a cell partition is within a first cell state parameter range corresponding to the cell partition. If the first cell state parameter is within the first cell state parameter range, performing step S204; and if the first cell state parameter is not within the first cell state parameter range, performing step S205.

The deviation of the first cell state parameter among individual cells belonging to a same cell partition is within a first deviation range.

S204: under a condition that the first cell state parameter of each cell in each of the cell partitions is within the first cell state parameter range corresponding to the cell partition, performing the following step for each of the cell partitions: estimating a cell state of each of the cell partitions based on a target cell state parameter corresponding to the cell partition.

Here the above steps of S201, S203 to S204 are the same steps as S101 to S103 as shown in FIG. 1, which will not be repeated herein.

S205: under a condition that the first cell state parameter of a first cell in a first cell partition is not within the first cell state parameter range corresponding to the first cell partition, adjusting the cell partition to which the first cell belongs based on the first cell state parameter of the first cell to obtain the adjusted cell partition.

In some embodiments of the present application, if it is determined that there is a first cell in the first cell partition, its corresponding first cell state parameter is not within the first cell state parameter range corresponding to the first cell partition, it can be understood that the first cell state parameter (the OCV curve and/or the cell capacity) have changed due to aging and other reasons. In view of this, in order to ensure the accuracy of the battery state estimation, it is necessary to adjust the cell partition of the first cell.

For example, the first cell state parameter of the first cell is compared with the first cell state parameters of the cells included in each of cell partitions included in the battery (for example, the battery includes a cell partition A, a cell partition B, a cell partition C, and a cell partition D). If the deviation between the first cell state parameter of the first cell and the first cell state parameter of each cell included in the cell partition A is within the first deviation range, it can be understood that the first cell state parameter of the first cell is within the first cell state parameter range corresponding to the cell partition A. In this way, the first cell can be adjusted to cell partition A.

S206: performing the following step for each adjusted cell partition: estimating the cell state of the adjusted cell partition based on the target cell state parameter corresponding to the adjusted cell partition.

S207: under a condition that there are no multiple cell partitions, partitioning each cell based on the first cell state parameter of each cell to assign the cells among which a deviation of the first cell state parameter is within the first deviation range to a same cell partition.

S208: performing the following step for each of the cell partitions: estimating the cell state of each of the cell partitions based on the target cell state parameter corresponding to the cell partition.

S209: estimating the battery state of the battery based on the cell state.

In the embodiment of the present application, by obtaining a first cell state parameter of each of a plurality of cells in a battery, and under a condition that there are cell partitions, by determining that the first cell state parameter of each cell belonging to a cell partition is within the first cell state parameter range corresponding to the cell partition, it is possible to estimate the cell state in each of the cell partitions just using the target cell state parameter corresponding to each of the cell partitions. In this way, when estimating the battery state of the battery, a unified standard is no longer used. Instead, the cell state of each of the cell partitions is calculated according to the target cell state parameter of each of the cell partitions in the battery, so that the battery state is estimated according to the cell state of each of the cell partitions, thereby improving the accuracy of the battery state estimation. In addition, under a condition that there are no multiple cell partitions, each cell will be partitioned according to the first cell state parameter of each cell; or under a condition that the first cell state parameter of the first cell belonging to the first cell partition is not within the first cell state parameter range corresponding to the first cell partition, the cell partition to which the cell belongs can also be adjusted, so that it can be more accurate in estimating the battery status in the future.

In some embodiments of the present application, after step S209, the method may further include: in every preset time period, repeating steps S201 to S209 to update and adjust the divided cell partitions, and estimate the battery status, thereby improving the accuracy of battery state estimation, wherein the preset time period can be set according to battery performance or use requirements, which is not limited herein.

Based on the same inventive concept, the present application also provides a battery state estimation apparatus, which will be described in detail with reference to FIG. 3.

Figure 3:
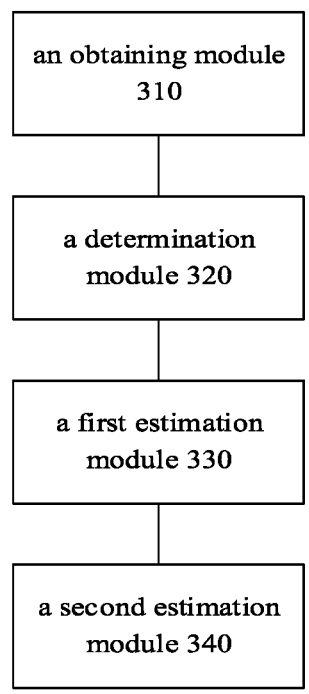
FIG. 3 is a schematic structural diagram of a battery state estimation apparatus provided by an embodiment of the present application.

FIG. 3 is a schematic structural diagram of a battery state estimation apparatus according to an embodiment of the present application.

As shown in FIG. 3, the battery state estimation apparatus includes:

an obtaining module 310, which is configured to obtain a first cell state parameter of each of a plurality of cells in a battery;

a determination module 320 configured to, under a condition that there are multiple cell partitions, perform the following step for each of the cell partitions: determining whether the first cell state parameter of each cell belonging to a cell partition is within a first cell state parameter range corresponding to the cell partition;

a first estimation module 330 configured to, under a condition that the first cell state parameter of each cell in each of the cell partitions is within the first cell state parameter range corresponding to the cell partition, perform the following step for each of the cell partitions: estimating the cell state of each of the cell partitions based on a target cell state parameter corresponding to the cell partition;

a second estimation module 340 configured to estimate a battery state of the battery based on the cell state;

wherein a deviation of the first cell state parameter among individual cells belonging to a same cell partition is within a first deviation range.

In the embodiment of the present application, by obtaining a first cell state parameter of each of a plurality of cells in a battery, and under a condition that there are multiple cell partitions, by determining that the first cell state parameter of each cell belonging to a cell partition is within the first cell state parameter range corresponding to the cell partition, it is possible to estimate the cell state in each of the cell partitions just using the target cell state parameter corresponding to each of the cell partitions. In this way, when estimating the battery state of the battery, since the target cell state parameters corresponding to respective cell partitions are different, a unified standard is no longer used when estimating the battery state. Instead, the cell state of each of the cell partitions is calculated according to the target cell state parameter of each of the cell partitions in the battery, so that the battery state is estimated according to the cell state of each of the cell partitions, thereby improving the accuracy of the battery state estimation.

In some embodiments of the present application, the battery state estimation apparatus further includes:

an adjustment module configured to, under a condition that the first cell state parameter of a first cell in a first cell partition is not within the first cell state parameter range corresponding to the first cell partition, adjust the cell partition to which the first cell belongs based on the first cell state parameter of the first cell to obtain the adjusted cell partition;

a third estimation module configured to perform the following step for each adjusted cell partition: estimating the cell state of the adjusted cell partition based on the target cell state parameter corresponding to the adjusted cell partition.

In some embodiments of the present application, the battery state estimation apparatus further includes:

a partition module, after obtaining the first cell state parameter of each of the plurality of cells in the battery, the partition module is configured to, under a condition that there are no multiple cell partitions, partition the cells based on the first cell state parameter of each cell to assign the cells among which a deviation of the first cell state parameter is within the first deviation range in a same cell partition;

a fourth estimation module configured to perform the following step for each of the cell partitions: estimating the cell state of each of the cell partitions based on the target cell state parameter corresponding to the cell partition.

In some embodiments of the present application, the obtaining module 310 specifically includes:

an obtaining unit configured to obtain a cell parameter of each cell, and the cell parameter include at least one of voltage, current, and temperature;

a calculation unit configured to calculate the first cell state parameter of the corresponding cell based on the cell parameter.

In some embodiments of the present application, the first cell state parameter includes an OCV curve and/or a cell capacity.

In some embodiments of the present application, the cell state includes at least one of: a state of charge, a state of health, and a state of power.

Other details of the battery state estimation apparatus according to the embodiment of the present application are similar to the method according to the embodiment of the present application described above in conjunction with FIG. 1, which will not be repeated herein.

Figure 4:
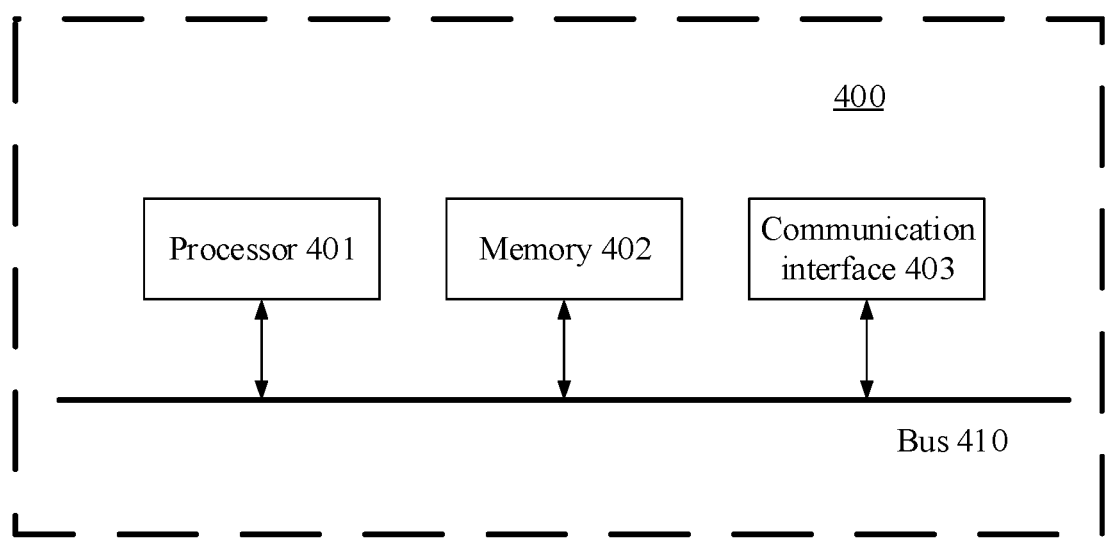
FIG. 4 is a battery state estimation system provided by an embodiment of the present application.

The battery state estimation method and apparatus according to the embodiments of the present application described in conjunction with FIGS. 1 to 3 may be implemented by a battery state estimation system of the battery. FIG. 4 is a schematic diagram showing a hardware structure 400 of a battery state estimation system according to an embodiment of the application.

As shown in FIG. 4, the battery state estimation system 400 in this embodiment includes: a processor 401, a memory 402, a communication interface 403, and a bus 410. The processor 401, the memory 402, and the communication interface 403 are connected and communicated between each other through the bus 410.

Specifically, the aforementioned processor 401 may include a central processing unit (CPU) or a specific integrated circuit (ASIC), or may be configured to implement one or more integrated circuits of the embodiments of the present application.

The memory 402 may include a mass memory for data or instructions. By way of example and not limitation, the memory 402 may include an HDD, a floppy disk drive, a flash memory, an optical disk, a magneto-optical disk, a magnetic tape, or a universal serial bus (USB) drive, or a combination of two or more of them. Where appropriate, the memory 402 may include removable or non-removable (or fixed) medium. Where appropriate, the memory 402 may be internal or external to the battery management system 400. In a particular embodiment, the memory 402 is a non-volatile solid state memory. In a particular embodiment, the memory 402 includes read-only memory (ROM). Where appropriate, the ROM may be mask-programmed ROM, programmable ROM (PROM), erasable PROM (EPROM), electrically erasable PROM (EEPROM), electrically rewritable ROM (EAROM) or flash memory or a combination of two or more of them.

The communication interface 403 is mainly used to implement communication between various modules, apparatuses, units and/or devices in the embodiments of the present application.

The bus 410 includes hardware, software, or both, and couples the components of the battery management system 400 to each other. By way of example and not limitation, the bus may include accelerated graphics port (AGP) or other graphics bus, enhanced industry standard architecture (EISA) bus, front side bus (FSB), hypertransport (HT) interconnection, industry standard architecture (ISA) bus, unlimited bandwidth interconnection, low pin count (LPC) bus, memory bus, microchannel architecture (MCA) bus, peripheral component interconnect (PCI) bus, PCI-Express (PCI-X) bus, serial advanced technology attachment (SATA) bus, Video Electronics Standards Association Local Bus (VLB) or other suitable bus or a combination of two or more of them. Where appropriate, the bus 410 may include one or more buses. Although the embodiments of this application describe and show a specific bus, this application considers any other suitable bus or interconnection.

In other words, the battery management system 400 shown in FIG. 4 may be implemented as including: a processor 401, a memory 402, a communication interface 403, and a bus 410. The processor 401, the memory 402, and the communication interface 403 are connected and communicated with each other through the bus 410. The memory 402 is used to store program code; the processor 401 runs a program corresponding to the executable program code by reading the executable program code stored in the memory 402, so as to execute the method for performing battery charging control in any embodiment of the present application, thereby implementing the battery state estimation method and apparatus described in conjunction with FIGS. 1-3.

An embodiment of the present application also provides a computer storage medium, and the computer storage medium has computer program instructions stored thereon; the computer program instructions, when executed by a processor, implement the battery state estimation method provided in the embodiment of the present application is implemented.

It should be clear that the present application is not limited to the specific configuration and processing described above and shown in the figures. For the sake of brevity, a detailed description of the known method is omitted herein. In the above embodiments, several specific steps are described and shown as examples. However, the method process of the present application is not limited to the specific steps described and shown. After understanding the inventive concept of the present application, those skilled in the art can make various changes, modifications and additions, or change the order between the steps.

The functional blocks shown in the above structural block diagram can be implemented as hardware, software, firmware, or a combination thereof. When implemented in hardware, it can be, for example, an electronic circuit, an application specific integrated circuit (ASIC), appropriate firmware, a plug-in, a function card, and so on. When implemented in software, the elements of the present application are programs or code segments used to perform required tasks. The programs or code segments may be stored in a machine-readable medium, or transmitted on a transmission medium or a communication link through a data signal carried in a carrier wave. "Machine-readable medium" may include any medium that can store or transmit information. Examples of machine-readable media include electronic circuits, semiconductor memory devices, ROM, flash memory, erasable ROM (EROM), floppy disks, CD-ROMs, optical disks, hard disks, fiber optic media, radio frequency (RF) links, and so on. The code segment can be downloaded via a computer network such as the Internet, an intranet, and so on.

The above are only specific implementations of the present application. Those skilled in the art can clearly understand that for the convenience and conciseness of description, the specific working process of the above-described system, module and unit can refer to the corresponding process in the foregoing method embodiment, which is not repeated herein. It should be understood that the protection scope of the present application is not limited to this, and any person skilled in the art can easily think of various equivalent modifications or replacements within the technical scope disclosed in the present application, and these modifications or replacements should be covered within the protection scope of the present application.

What is claimed is:

1. A battery state estimation method, comprising:
    obtaining a first cell state parameter of each of a plurality of cells in a battery;
    under a condition that there are multiple cell partitions, performing the following step for each of the cell partitions: determining whether the first cell state parameter of each cell belonging to a cell partition is within a first cell state parameter range corresponding to the cell partition;
    under a condition that the first cell state parameter of each cell in each of the cell partitions is within the first cell state parameter range corresponding to the cell partition, performing the following step for each of the cell partitions: estimating a cell state of each of the cell partitions based on a target cell state parameter corresponding to the cell partition; and
    estimating a battery state of the battery based on the cell state;
    wherein a deviation of the first cell state parameter among individual cells belonging to a same cell partition is within a first deviation range.

2. The method according to claim 1, wherein after determining whether the first cell state parameter of each cell belonging to a cell partition is within the first cell state parameter range corresponding to the cell partition, the method further comprises:
    under a condition that the first cell state parameter of a first cell in a first cell partition is not within the first cell state parameter range corresponding to the first cell partition, adjusting the cell partition to which the first cell belongs based on the first cell state parameter of the first cell to obtain the adjusted cell partition;
    performing the following step for each adjusted cell partition: estimating the cell state of the adjusted cell partition based on the target cell state parameter corresponding to the adjusted cell partition.

3. The method according to claim 1, wherein after obtaining the first cell state parameter of each of the plurality of cells in the battery, the method further comprises:
    under a condition that there are no multiple cell partitions, partitioning the cells based on the first cell state parameter of each cell to assign the cells among which a deviation of the first cell state parameter is within the first deviation range to a same cell partition;
    performing the following step for each of the cell partitions: estimating the cell state of each of the cell partitions based on the target cell state parameter corresponding to the cell partition.

4. The method according to claim 1, wherein obtaining the first cell state parameter of each of the plurality of cells in the battery comprises:
  obtaining a cell parameter of each cell, wherein the cell parameter comprises at least one of: voltage, current, and temperature;
  calculating the first cell state parameter of a corresponding cell based on the cell parameter.

5. The method according to claim 1, wherein the first cell state parameter comprises an open circuit voltage (OCV) curve and/or a cell capacity.

6. The method according to claim 1, wherein the cell state comprises at least one of the following states: a state of charge, a state of health, and a state of power.

7. A battery state estimation device, comprising a memory, a processor, and a program stored in the memory and executable on the processor, wherein the program, when executed on the processor, causes the processor to:
  obtain a first cell state parameter of each of a plurality of cells in a battery;
  under a condition that there are multiple cell partitions, perform the following step for each of the cell partitions: determine whether the first cell state parameter of each cell belonging to a cell partition is within a first cell state parameter range corresponding to the cell partition;
  under a condition that the first cell state parameter of each cell in each of the cell partitions is within the first cell state parameter range corresponding to the cell partition, perform the following step for each of the cell partitions: estimating a cell state of each of the cell partitions based on a target cell state parameter corresponding to the cell partition; and
  estimate a battery state of the battery based on the cell state;
  wherein a deviation of the first cell state parameter among individual cells belonging to a same cell partition is within a first deviation range.

8. The device according to claim 7, wherein after determining whether the first cell state parameter of each cell belonging to a cell partition is within the first cell state parameter range corresponding to the cell partition, the program further causes the processor to:
  under a condition that the first cell state parameter of a first cell in a first cell partition is not within the first cell state parameter range corresponding to the first cell partition, adjust the cell partition to which the first cell belongs based on the first cell state parameter of the first cell to obtain the adjusted cell partition;
  perform the following step for each adjusted cell partition: estimating the cell state of the adjusted cell partition based on the target cell state parameter corresponding to the adjusted cell partition.

9. The device according to claim 7, wherein after obtaining the first cell state parameter of each of the plurality of cells in the battery, the program further causes the processor to:
  under a condition that there are no multiple cell partitions, partition the cells based on the first cell state parameter of each cell to assign the cells among which a deviation of the first cell state parameter is within the first deviation range to a same cell partition;
  perform the following step for each of the cell partitions: estimating the cell state of each of the cell partitions based on the target cell state parameter corresponding to the cell partition.

10. The device according to claim 7, wherein obtaining the first cell state parameter of each of the plurality of cells in the battery comprises:
  obtaining a cell parameter of each cell, wherein the cell parameter comprises at least one of: voltage, current, and temperature;
  calculating the first cell state parameter of a corresponding cell based on the cell parameter.

11. The device according to claim 7, wherein the first cell state parameter comprises an open circuit voltage (OCV) curve and/or a cell capacity.

12. The device according to claim 7, wherein the cell state comprises at least one of the following states: a state of charge, a state of health, and a state of power.

13. A non-transitory computer-readable storage medium having instructions stored thereon, wherein the instructions, when executed by a processor, cause the processor to:
  obtain a first cell state parameter of each of a plurality of cells in a battery;
  under a condition that there are multiple cell partitions, perform the following step for each of the cell partitions: determine whether the first cell state parameter of each cell belonging to a cell partition is within a first cell state parameter range corresponding to the cell partition;
  under a condition that the first cell state parameter of each cell in each of the cell partitions is within the first cell state parameter range corresponding to the cell partition, perform the following step for each of the cell partitions: estimating a cell state of each of the cell partitions based on a target cell state parameter corresponding to the cell partition; and
  estimate a battery state of the battery based on the cell state;
  wherein a deviation of the first cell state parameter among individual cells belonging to a same cell partition is within a first deviation range.

14. The non-transitory computer-readable storage medium according to claim 13, wherein after determining whether the first cell state parameter of each cell belonging to a cell partition is within the first cell state parameter range corresponding to the cell partition, the instructions further cause the processor to:
  under a condition that the first cell state parameter of a first cell in a first cell partition is not within the first cell state parameter range corresponding to the first cell partition, adjust the cell partition to which the first cell belongs based on the first cell state parameter of the first cell to obtain the adjusted cell partition;
  perform the following step for each adjusted cell partition: estimating the cell state of the adjusted cell partition based on the target cell state parameter corresponding to the adjusted cell partition.

15. The non-transitory computer-readable storage medium according to claim 13, wherein after obtaining the first cell state parameter of each of the plurality of cells in the battery, the instructions further cause the processor to:
  under a condition that there are no multiple cell partitions, partition the cells based on the first cell state parameter of each cell to assign the cells among which a deviation of the first cell state parameter is within the first deviation range to a same cell partition;
  perform the following step for each of the cell partitions: estimating the cell state of each of the cell partitions based on the target cell state parameter corresponding to the cell partition.

16. The non-transitory computer-readable storage medium according to claim 13, wherein obtaining the first cell state parameter of each of the plurality of cells in the battery comprises:
   obtaining a cell parameter of each cell, wherein the cell parameter comprises at least one of: voltage, current, and temperature;
   calculating the first cell state parameter of a corresponding cell based on the cell parameter.

17. The non-transitory computer-readable storage medium according to claim 13, wherein the first cell state parameter comprises an open circuit voltage (OCV) curve and/or a cell capacity.

18. The non-transitory computer-readable storage medium according to claim 13, wherein the cell state comprises at least one of the following states: a state of charge, a state of health, and a state of power.

* * * * *